(12) United States Patent
Yang et al.

(10) Patent No.: US 9,911,915 B2
(45) Date of Patent: Mar. 6, 2018

(54) MULTIPHASE SELECTORS

(71) Applicant: Hewlett Packard Enterprise Development LP, Houston, TX (US)

(72) Inventors: Jianhua Yang, Palo Alto, CA (US); Yoocharn Jeon, Palo Alto, CA (US); Hans S. Cho, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/318,089

(22) PCT Filed: Jul. 29, 2014

(86) PCT No.: PCT/US2014/048529
§ 371 (c)(1),
(2) Date: Dec. 12, 2016

(87) PCT Pub. No.: WO2016/018240
PCT Pub. Date: Feb. 4, 2016

(65) Prior Publication Data
US 2017/0125674 A1    May 4, 2017

(51) Int. Cl.
*H01L 45/00* (2006.01)
*H01L 27/24* (2006.01)

(52) U.S. Cl.
CPC ........ *H01L 45/146* (2013.01); *H01L 27/2418* (2013.01); *H01L 45/08* (2013.01); *H01L 45/1233* (2013.01); *H01L 45/165* (2013.01)

(58) Field of Classification Search
CPC ... H01L 45/146; H01L 45/145; H01L 45/165; G11C 13/0007
See application file for complete search history.

(56) References Cited

U.S. PATENT DOCUMENTS

| | | | |
|---|---|---|---|
| 4,422,917 A * | 12/1983 | Hayfield | C25B 11/04 204/196.01 |
| 4,526,629 A | 7/1985 | Latta et al. | |
| 5,281,496 A * | 1/1994 | Clarke | C04B 35/46 204/242 |

(Continued)

FOREIGN PATENT DOCUMENTS

WO    WO-2013162553 A1    10/2013

OTHER PUBLICATIONS

International Searching Authority, The International Search Report and the Written Opinion, PCT/US2014/048529, Apr. 24, 2015, 10 Pages.

(Continued)

*Primary Examiner* — Sitaramarao S Yechuri
(74) *Attorney, Agent, or Firm* — Hewlett Packard Enterprise Patent Department

(57) ABSTRACT

A multiphase selector includes a first electrode, a switching layer coupled to the first electrode, a capping layer coupled to the switching layer, and a second electrode coupled to the capping layer. The switching layer may include a matrix having a first, relatively insulating phase of a transition metal oxide; a second, relatively conducting phase of the transition metal oxide dispersed in the matrix; and a catalyst, located within the matrix, to interact with the first phase of the transition metal oxide to selectively form and position the second phase of the transition metal oxide within the matrix.

14 Claims, 4 Drawing Sheets

(56) References Cited

U.S. PATENT DOCUMENTS

| | | | | |
|---|---|---|---|---|
| 5,733,489 | A * | 3/1998 | Hill | C01G 23/043 |
| | | | | 264/109 |
| 6,914,255 | B2 * | 7/2005 | Lowrey | G11C 13/0004 |
| | | | | 257/2 |
| 7,846,807 | B2 | 12/2010 | Tang et al. | |
| 8,502,188 | B2 | 8/2013 | Pickett | |
| 8,525,553 | B1 | 9/2013 | Yi et al. | |
| 8,611,133 | B2 | 12/2013 | Pickett et al. | |
| 2011/0229990 | A1 | 9/2011 | Kreupl et al. | |
| 2012/0104346 | A1 | 5/2012 | Yi et al. | |
| 2012/0113706 | A1 * | 5/2012 | Williams | G11C 13/0007 |
| | | | | 365/148 |
| 2013/0021835 | A1 * | 1/2013 | Hwang | G11C 13/0002 |
| | | | | 365/148 |
| 2013/0099187 | A1 | 4/2013 | Pickett et al. | |
| 2013/0264534 | A1 * | 10/2013 | Hwang | H01L 45/145 |
| | | | | 257/2 |
| 2014/0301127 | A1 * | 10/2014 | Kim | G11C 13/0004 |
| | | | | 365/148 |
| 2015/0263069 | A1 * | 9/2015 | Jo | H01L 45/085 |
| | | | | 365/148 |

OTHER PUBLICATIONS

Ion Bombardment Modification of Surfaces, Fundamentals and Applications, edited by Orlando Auciello and Roger Kelly (Elsevier, 1984), 10 Pages.

Moline, R.A., Recoil Implantation, Ion Implantation in Semiconductors 1976 (1977), pp. 319-331.

Pickett, D. et al., A Scalable Neunstor Built with Mott Memristors, Nature Materials; Letters—Advanced Online Publication, Dec. 16, 2012, pp. 1-4.

Stroud, P.T., et al., Proceedings of the European Conference on Ion Implantation (Peter Peregrinus; Stevenage, 1970), 8 pages.

* cited by examiner

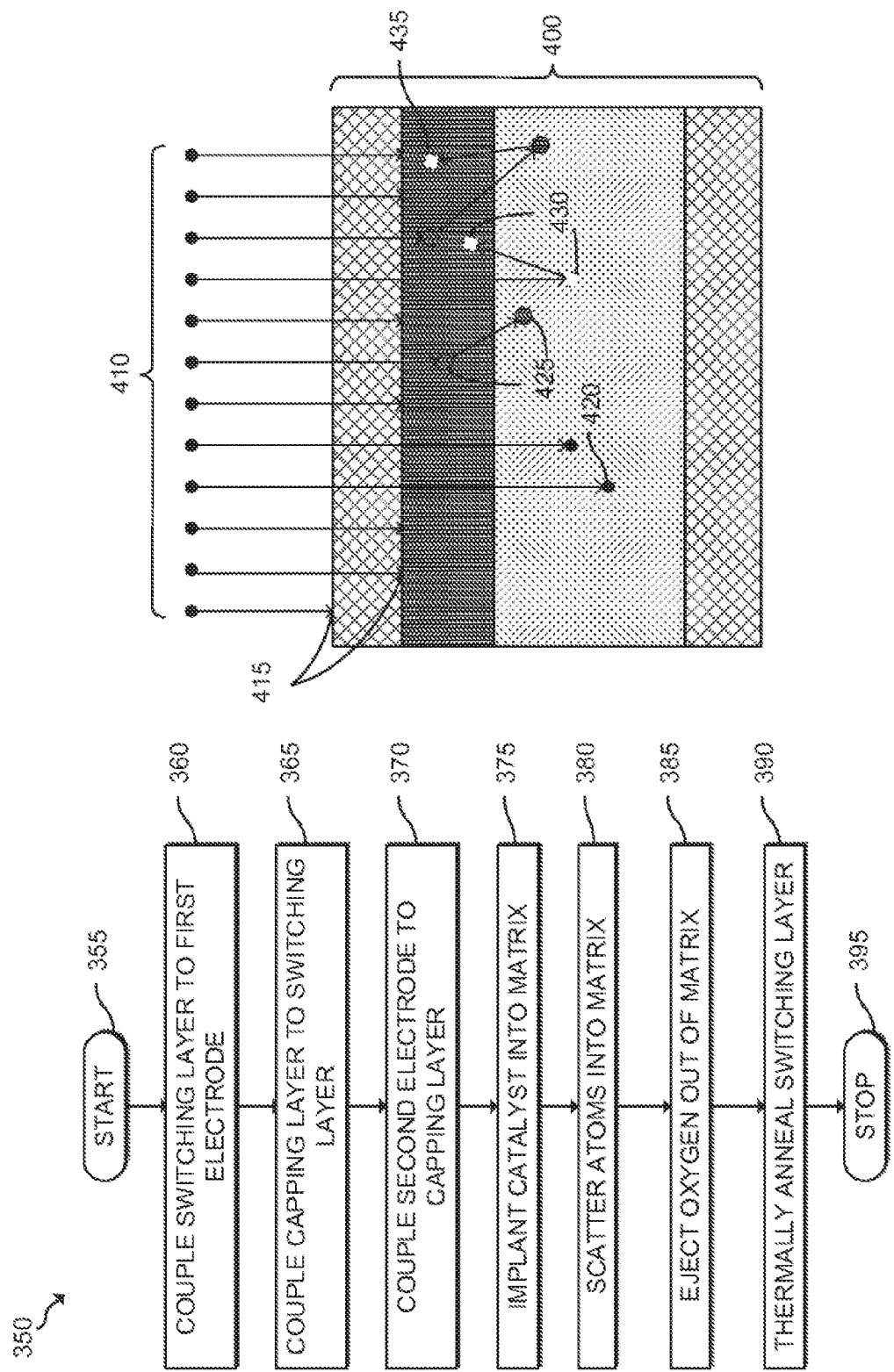

MULTIPHASE SELECTORS

BACKGROUND

Selectors are devices that may control the electrical properties of electronic devices containing said selectors. Selectors may be combined with memristors to form crossbar arrays of memory devices. Memristors are devices that can be programmed to different resistive states by applying a programming energy, such as a voltage. Large crossbar arrays of memory devices can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein:

FIG. 3B is a flowchart of an example method for manufacturing a multiphase selector including scattering atoms, ejecting oxygen, and thermal annealing a switching layer, according to an example;

FIG. 4 is a schematic of a cross-sectional view of an example multiphase selector during the execution of the method of FIG. 3B, according to an example;

DETAILED DESCRIPTION

Figure 1A:
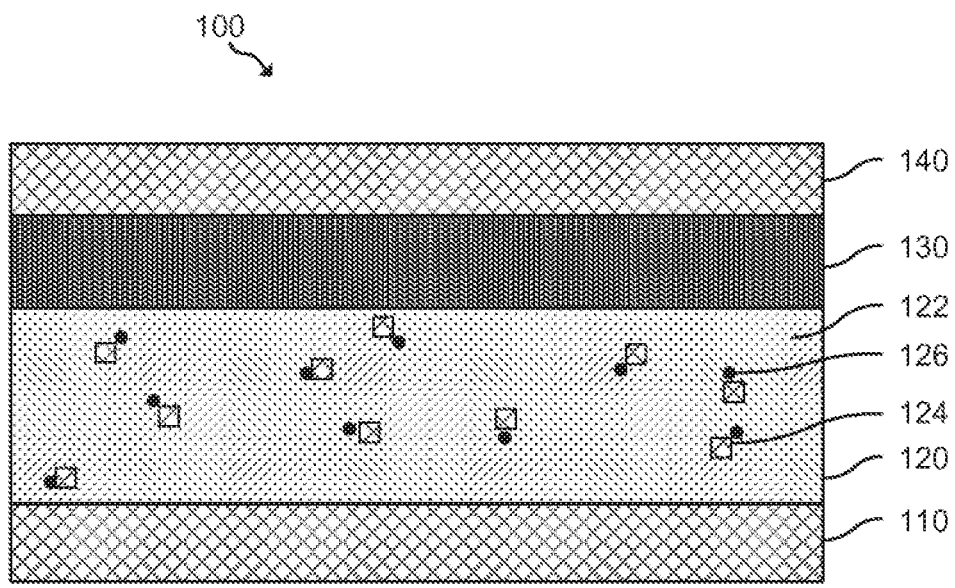
FIG. 1A is a cross-sectional view of an example multiphase selector, according to an example.

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON".

Using memristors in crossbar arrays may lead to read or write failure due to sneak currents passing through the memory cells that are not targeted—for example, cells on the same row or column as a targeted cell. Failure may arise when the total current through the circuit from an applied voltage is higher than the current through the targeted memristor due to current sneaking through untargeted neighboring cells. Using a transistor coupled in series with each memristor has been proposed to isolate each cell and overcome the sneak current. However, using a transistor with each memristor in a crossbar array limits array density and increases cost, which may impact commercialization. As a result, effort has been spent to investigate using a nonlinear selector coupled in series with each memristor in order to increase the current-voltage nonlinearity of each memory cell of a crossbar array. One type of selector being investigated exhibits so called insulator-to-metal transition, meaning that a selector transitions from an electrically insulating state to an electrically conducting state similar to a metal.

However, some proposed selectors allow excess leakage current in the insulator ("unselected") state. In other words, some selectors may not be resistive enough, or too conducting, in the unselected state. On the flip side, some proposed selectors transition at relatively high threshold voltages. In other words, a high voltage may need to be applied in order to switch the selector from the unselected, insulating state to the selected, conducting state. The combination of these two issues presents a challenge for currently proposed solutions because selectors with the desired resistance in the unselected state typically have a relatively high threshold voltage for switching.

Examples herein provide for multiphase selectors. In example implementations, a multiphase selector has a switching layer, which includes a matrix of a first, relatively insulating phase of a transition metal oxide; a second, relatively conducting phase of the metal oxide dispersed in the matrix; and a catalyst located within the matrix to interact with the first phase of the transition metal oxide to selectively form and position the second phase within the matrix. When a voltage greater than a threshold voltage is applied, the second phase of the metal oxide may form conducting channels for current to travel through the switching layer, thereby allowing the transition of the switching layer from an unselected state to a selected state. By having a switching layer with an insulating matrix and a more conducting second phase, a multiphase selector may exhibit a desired high resistance in the unselected state due to the prominence of the first phase in the matrix, and it may have a lower threshold voltage due to the dispersion of the second phase in the matrix. Accordingly, multiphase selectors herein may be desirable for use in conjunction with memristors or other memory devices in a crossbar or other memory structure.

Referring now to the figures, FIG. 1A depicts a cross-sectional view of an example multiphase selector 100. Multiphase selector 100 may have a first electrode 110, a switching layer 120, a capping layer 130, and a second electrode 140. Switching layer 120 may be coupled to first electrode 110, and switching layer 120 may have a matrix 122 of a first, relatively insulating phase of a transition metal oxide; a second, relatively conducting phase 124 of the transition metal oxide dispersed in matrix 122; and a catalyst 126 located within matrix 122 to interact with the first phase of the transition metal oxide to selectively form and position second phase 124 within matrix 122.

Multiphase selector 100 may be an electrical component placed in series with other components, such as memristors, that controls the overall electrical properties of resulting combination devices. Multiphase selector 100 may have switching layer 120 which may have a plurality of phases of various materials, including materials that exhibit insulator-to-metal transition in certain voltage ranges. In other words, a material may switch from behaving as an insulator to behaving as a conducting metal when a voltage greater than a threshold voltage is applied. Correspondingly, the material may behave as an insulator when a voltage less than a threshold voltage is applied or if no voltage is applied. Accordingly, due to the abrupt change in conductivity at a threshold voltage, multiphase selector 100 may exhibit nonlinear current-voltage behavior in certain voltage ranges. In other words, when a voltage greater than a threshold voltage is applied across multiphase selector 100, the current passing through multiphase selector 100 changes by an amount greater than the proportional increase in voltage. In some implementations, the threshold voltage for multiphase selector 100 may be within a voltage range of interest, such as, for example, the voltage ranges used for reading or writing memory devices in crossbar arrays.

As described above, multiphase selector 100 may have switching layer 120 coupled to first electrode 110. As used herein, components may be coupled by forming an electrical connection between the components. For example, switching layer 120 may be coupled to first electrode 110 by forming a direct, surface contact between the two. First electrode 110 may be an electrical conductor that, in some implementations, serve as the connection for multiphase 100 to other components. For example, first electrode 110 may connect multiphase selector 100 to lines or a crossbar array. Non-limiting example materials for first electrode 110 include Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $Ti_5Si_3$, $TaSi_2$, $WSi_2$, $NbSi_2$, $V_3Si$, electrically doped polycrystalline Si, electrically doped polycrystalline Ge, and combinations thereof.

Switching layer 120 may be the active region within multiphase selector 100 that provides the switching properties of multiphase selector 100. Switching layer 120 may have matrix 122, which contains a transition metal oxide in a first, relatively insulating phase. Matrix 122 may be the principal structure of switching layer 122, and in some implementations, matrix 122 may make up the entirety of switching layer 120. In some other examples, matrix 122 may make up a portion of switching layer 120. Switching layer 120 may be generally insulating doe to the predominant first phase of the transition metal oxide in matrix 122. The metal that forms the metal oxide may be selected from a number of suitable candidates, including niobium (Nb), tantalum (Ta), vanadium (V), titanium (Ti), chromium (Cr). In one particular example, the first phase in matrix 122 may be niobium pentoxide ($Nb_2O_5$).

Switching layer 120 may be nonhomogeneous and may also have second phase 124 of the transition metal oxide dispersed in matrix 122. Second phase 124 may be relatively conducting compared to the first phase of matrix 122. In some examples, second phase 124 may be less oxygen-rich than the first phase. In a particular example, second phase 124 may be niobium dioxide ($NbO_2$). In some examples, second phase 124 may be formed within the matrix 122 out of the first phase. In other words, switching layer 120 may be formed, for example, by first forming a matrix 122 made of $Nb_2O_5$. A chemical reaction may then be promoted where $NbO_2$ is formed out of the $Nb_2O_5$ matrix. From such reactions, second phase 124 may tend to form in clusters of varying sizes, including clusters of single molecules and clusters several nanometers across or larger. In some examples, the average size of the clusters of second phase 124 within matrix 122 may be two nanometers or less.

The presence of second phase 124 within matrix 122 may be the cause of the insulator-to-metal transition ability of switching layer 120. Because second phase 124 is more conducting than the first phase of the transition metal oxide, a current channel may be formed in matrix 122 at a lower voltage than would be normally required through matrix 122 without second phase 124. Second phase 124 may be distributed throughout matrix 122 to allow current channels to form through all of switching layer 120 and create a continuous electrical path through switching layer 120.

In addition to second phase 124, catalysts 126 may be located within matrix 122 to interact with the first phase of the transition metal oxide to selectively form and position second phase 124 within matrix 122. A catalyst may be a material that increases the rate of a chemical reaction due to its presence or participation in the reaction. In examples herein, catalyst 126 may promote the formation of second phase 124 out of the first phase within matrix 122. In a specific example, catalyst 126 may be silicon, which may act as an acceptor for oxygen atoms. Other examples materials include Al, Hf, Zr, Ca, Mg, Sc, Sm, Er, Gd, Ho, Dy, Y, Sr, and Ba. Generally, catalyst 126 may reduce the first phase of matrix 122 to form an electrically insulating oxide that is more thermodynamically stable than the oxides of the transition metal of matrix 122. For the specific, example, silicon may attract oxygen atoms from the first phase $Nb_2O_5$ of matrix 122 to form silicon oxide ($SiO_2$). Removing oxygen atoms from the first phase may form second phase 124, which may be $NbO_2$.

Catalyst 126 may be distributed within matrix 122 in such as manner as to selectively form and position second phase 124. In some examples, catalyst 126 may be introduced into matrix 122 after capping layer 130 has been coupled to switching layer 120. Details of the processes of introducing catalyst 126 are described in detail below.

Capping layer 130 may be coupled to switching layer 120. In some examples, switching layer 120 may contain materials which may be difficult to manufacture and maintain a proper stoichiometry particularly when exposed to environments such as the atmosphere. Capping layer 130 may cover switching layer 120 and may protect the materials of switching layer 120 from exposure to the external environment or other materials. Capping layer 130 may have a number of materials, including metals, semiconductors, or combinations of materials. Examples of capping layer materials include Ta, Ti, Si, Ge, $TaSi_2$, and $TiSi_2$. In some implementations, capping layer 130 may include multiple layers of different materials. In the particular example described above, capping layer 130 may have niobium. In addition to covering switching layer 120, capping layer 130 may provide additional advantages, details of which are described below.

Second electrode 140 may be coupled to capping layer 130. Like first electrode 110, second electrode 140 may be an electrical conductor that, in some implementations, serve as the connection for multiphase 100 to other components. For example, Second electrode 140 may connect multiphase selector 100 to lines of a crossbar array. Non-limiting example materials for second electrode 140 include Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $Ti_5Si_3$, $TaSi_2$, $WSi_2$, $NbSi_2$, $V_3Si$, electrically doped Si polycrystalline, electrically doped Ge polycrystalline, and combinations thereof.

Catalysts 126 may be introduced into matrix 126 by a variety of processes, including processes performed after the structure of multiphase selector 100 described above has been manufactured. In some examples, each of first electrode 110, switching layer 120, capping layer 130, and second electrode 140 may be formed by sequential deposition. For example, switching layer 120 may be deposited on top of first electrode 110, capping layer 130 may then be deposited on switching layer 120, and then second electrode 140 may be deposited on capping layer 130. Switching layer 120 may be deposited with matrix 122 having only the first phase of the transition metal oxide. Because it is easier to form second phase 124 out of the first phase compared to directly forming a matrix with two phases, catalysts 126 may be introduced after capping layer 130 has been coupled to switching layer 120 in order to promote the formation of second phase 124.

In some implementations, catalysts 126 may be implanted within matrix 122 by bombarding multiphase selector 100 with atoms of catalyst 126. Controlling the bombardment of atoms may allow the penetration of a controllable amount of catalyst 126 into matrix 122. Generally, bombarding catalyst 126 atoms may pass through second electrode 140 and capping layer 130. The presence of second electrode 140 and capping layer 130 may prevent some or many of the bombarding catalyst 126 atoms from reaching matrix 122. However, when atoms of catalyst 126 collide with some atoms of capping layer 130, some of the atoms of capping layer 130 may be recoiled and scattered into matrix 122 of switching layer 120. In instances where capping layer 130 includes the same metal as the metal of the transition metal oxide of matrix 122, the scattered atoms of capping layer 130 may interact with the first phase of the transitional metal oxide to form second phase 124. For a specific example, Nb atoms of capping layer 130 may be recoiled into matrix 122 having $Nb_2O_5$ as the first phase. The extra Nb atoms may react with $Nb_2O_5$ to form clusters of $NbO_2$ as second phase 124. Such reactions may produce additional oxygen atoms, such as by dislodging oxygen atoms from the first phase of the transition metal oxide, and in some examples, some of these oxygen atoms may be ejected out of matrix 122, leaving oxygen vacancies in matrix 122.

Because it is desirable to have catalyst 126 pass through second electrode 140 and collide with some atoms of capping layer 130, second electrode 140 may contain a material with a scattering cross-section that is less than the scattering cross-section of a material of capping layer 130. A scattering cross-section may represent an area of scattering centers within a medium which affects the likelihood of a scattering collision when a particle is traveling through the medium. Specifically, when catalyst 126 atoms, such as Si, are bombarding multiphase selector 100, bombarding atoms may more likely be scattered by atoms of capping layer 130 than by atoms of second electrode 140 due to the larger scattering cross-section of capping layer 130.

Lastly, implanting catalysts 126 may cause heating within matrix 122. Heating may occur due to the collisions of atoms and particles during bombardment of catalyst 126 atoms. In some examples, such heating may promote an annealing effect in matrix 122. An annealing effect may stimulate reactions such as the formation of second phase 124 out of the first phase. For a specific example, a heat annealing effect may promote the reaction of $Nb_2O_5$ with additional Nb or catalyst 126 atoms to form $NbO_2$. Further details of the implantation of catalyst 126 and the formation of second phase 124 out of the first phase of matrix 122 are described in further detail below in relation to FIG. 4.

Figure 1B:
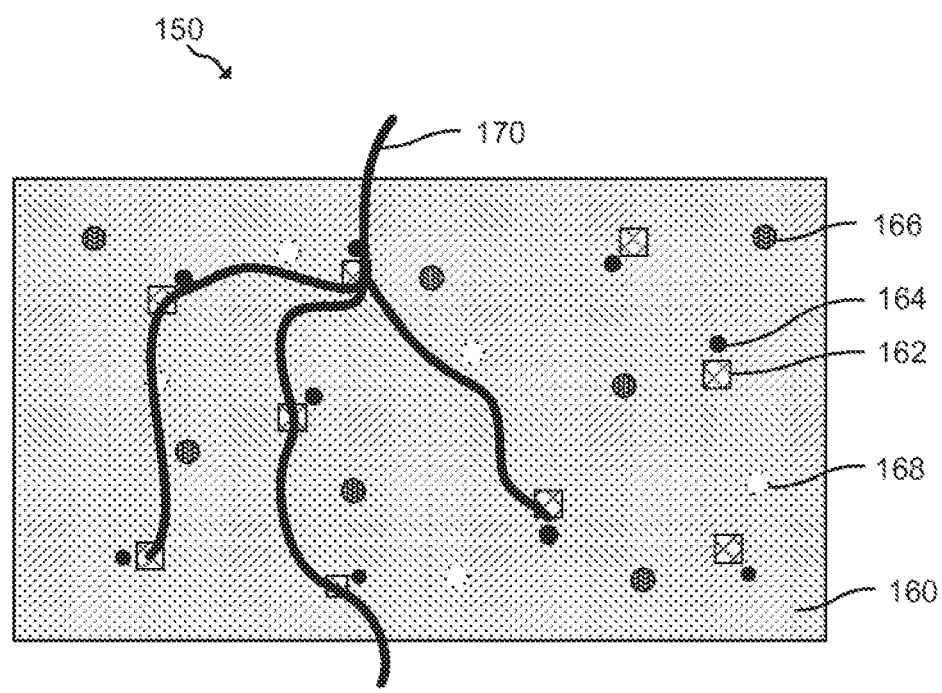
FIG. 1B is a cross-sectional view of a switching layer of the example multiphase selector of FIG. 1A, according to an example.

FIG. 1B depicts a cross-sectional view of an example switching layer 150, which may be switching layer 120 of example multiphase selector 100 depicted in FIG. Switching layer 150 may include matrix 160 having a first, relatively insulating phase of a transition metal oxide, such as $Nb_2O_5$. Matrix 160 may contain second phase 162 dispersed throughout matrix 160. Second phase 162 may be a second, more conducting phase of the transition metal oxide, such as $NbO_2$. Second phase 162 may be formed out the first phase, where the reaction may be stimulated by catalysts 164 located within matrix 160.

Catalysts 164 may be implanted within matrix 160 by bombardment methods such as described in relation to FIG. 1A. Such processes may introduce scattered atoms 166 of the metal of the capping layer, which may be the same metal as that of matrix 160. In a specific example, Nb atoms 166 may be scattered from the capping layer into matrix 160, where the atoms 166 may interact with the first phase of matrix 160. For example, the extra Nb may react with $Nb_2O_5$ to form $NbO_2$ as second phase 164. Accordingly, processes for implanting catalyst 164 may also introduce oxygen vacancies 168 in matrix 160 by ejecting out oxygen atoms released during the formation reaction of second phase 162.

Due to the presence of second phase 162, switching layer 150 may form a current channel 170 when a voltage greater than a threshold voltage is applied. While FIG. 1B shows one current channel 170 formed through switching layer 150, it should be noted that there may be multiple current channels formed, some of which may extend through all of switching layer 150 and some of which may terminate within matrix 160. Due to the predominant presence of the first, more insulating phase, switching layer 150 may have a relatively high resistance in the unselected state. However, the presence of current channel 170 formed by second phase 162 allows switching layer 150 to switch to a conducting ("selected") state at a lower threshold voltage than a switching layer without second phase 162. This transition may be referred to as the insulator-to-metal transition mentioned above.

Figure 2:
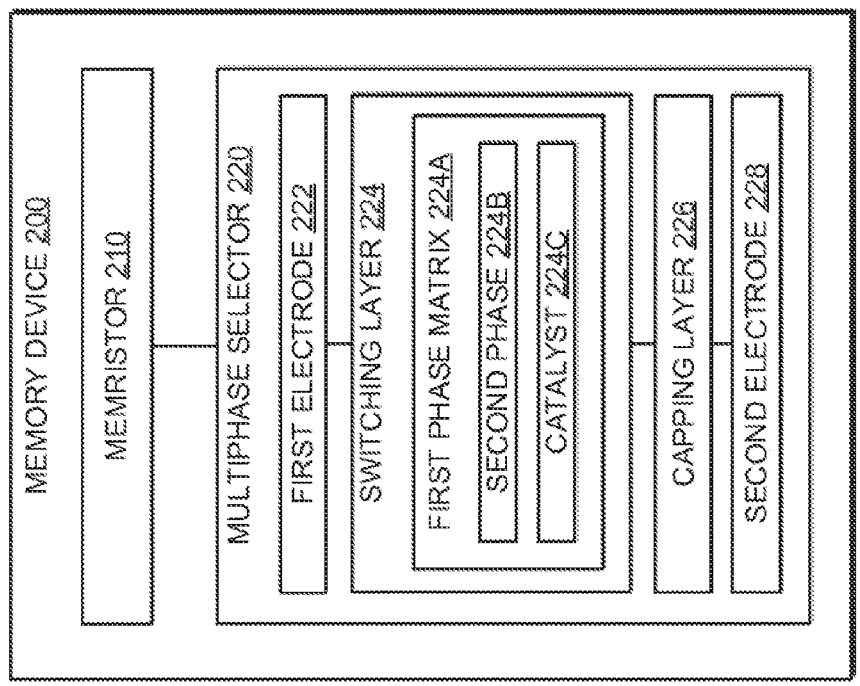
FIG. 2 is a block diagram of an example memory device having a memristor and a multiphase selector, according to an example.

FIG. 2 depicts a memory device 200 having a memristor 210 and a multiphase selector 220. Multiphase selector 220 may have a first electrode 222, a switching layer 224, a capping layer 226, and a second electrode 228. Switching layer 224 may be coupled to first electrode 222, and switching layer 224 may have a matrix 224A of a first, relatively insulating phase of a transition metal oxide; a second, relatively conducting phase 224B of the transition metal oxide dispersed in matrix 224A; and a catalyst 224C located within matrix 224A to interact with the first phase of the transition metal oxide to selectively form and position second phase 224B within matrix 224A.

Similar to multiphase selector 100 of FIG. 1A, multiphase selector 220 may be an electrical component placed in series with other components—such as memristor 210—that controls the overall electrical properties of resulting combination devices, such as memory device 200. Multiphase selector 220 may exhibit insulator-to-metal transition at a threshold voltage, which may be controlled by switching layer 224. Switching layer 224 may include matrix 224A having the first phase of the transition metal oxide. Second phase 224B and catalyst 224C may be dispersed within matrix 224A, where catalyst 2240 may have been introduced into matrix 224A to interact with the first phase to form second phase 224B. In some examples, catalyst 224C may be implanted into matrix 224A after capping layer 226 has been coupled to switching layer 224. In such instances, matrix 224A may contain other components, such as atoms of the capping layer and oxygen vacancies. Capping layer 226 may contain a variety of materials, including metals, semiconductors, or multiple materials. In some examples, capping layer 226 may contain the same metal as that of the transition metal oxide of matrix 224A.

Due to the presence of second phase 224B, switching layer 224 may form a current channel when a voltage greater than a threshold voltage is applied. Due to the predominant presence of the first, more insulating phase in matrix 224A, switching layer 224 may have a relatively high resistance in the unselected state. However, the presence of the current channels formed by second phase 224B allows switching layer 224 to transition to a conducting state at a lower threshold voltage than a switching layer without second phase 224B. Accordingly, multiphase selector 220 may be effectively used in a memory device with memristor 210.

Memristor 210 may be an electrical device that has resistance that changes with an applied voltage across or through memristor 210. Furthermore, memristor 210 may "memorize" its last resistance. In this manner, memory device 200 having memristor 210 may be set to at least two states. Memory device 200 may be one of many devices in a larger structure, such as a crossbar array. For example, each memory device 200 may be a single memory cell in an array. An array of multiple memory devices 200, which has memristor 210 and multiphase selector 220, may be utilized, for example, in nonvolatile resistive memory.

Memristor 210 may be based on a variety of materials. Memristor 210 may be oxide-based, meaning that at least a portion of the memristor is formed from an oxide-containing material. Memristor 210 may also be nitride-based, meaning that at least a portion of the memristor is formed from a nitride-containing composition. Furthermore, memristor 210 may be oxy-nitride based, meaning that a portion of the memristor is formed from an oxide-containing material and that a portion of the memristor is formed from a nitride-containing material. In some examples, memristor 210 may be formed based on tantalum oxide ($TaO_x$) or hafnium oxide ($HfO_x$) compositions. Other example materials of memristor 210 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristors may be employed in the practice of the teachings herein. For example, memristor 210 may have multiple layers that include electrodes and dielectric materials.

Figure 3A:
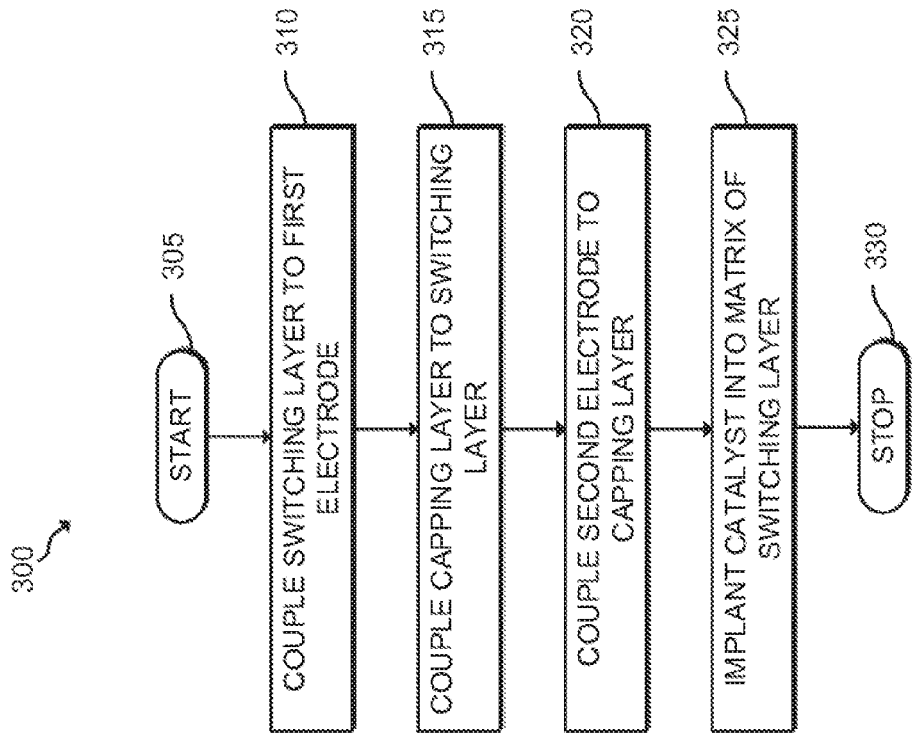
FIG. 3A is a flowchart of an example method for manufacturing a multiphase selector, according to an example.

FIG. 3A is a flowchart depicting an example method 300 for manufacturing a multiphase selector. Method 300 may include block 310 for coupling a switching layer to a first electrode, block 315 for coupling a capping layer to the switching layer, block 320 for coupling a second electrode to the capping layer, and block 325 for implanting catalysts into a matrix of the switching layer. Although execution of method 300 is herein described in reference to multiphase selector 100 of FIG. 1A, other suitable parties for implementation of method 300 should be apparent.

Method 300 may start in block 305 and proceed to block 310, where switching layer 120 is coupled to first electrode 110. Coupling may mean forming an electrically-conducting connection between components. For example, selector 260 may be placed in physical contact with first electrode 290. First electrode 110 may be an electrical conductor that, in some implementations, serve as the connection for multiphase selector 100 to other components. For example, first electrode 110 may connect multiphase selector 100 to lines of a crossbar array. In a particular example, first electrode 110 may be made of titanium nitride (TiN).

Switching layer 120 may be the active region within multiphase selector 100 that provides the switching properties of multiphase selector 100. Switching layer 120 may have matrix 122, which contains a transition metal oxide in a first, relatively insulating phase. Switching layer 120 may be generally insulating due to the predominant first phase of the transition metal oxide in matrix 122. Switching layer 120 may also have second phase 124 of the transition metal oxide dispersed in matrix 122. Second phase 124 may be relatively conducting compared to the first phase of matrix 122. In some examples, second phase 124 may be formed within the matrix 122 out of the first phase via a chemical reaction. From such reactions, second phase 124 may tend to form in clusters of varying sizes, including clusters of single molecules and clusters several nanometers across or larger. In a specific example, second phase 124 may have clusters having an average size of two nanometers or less.

The presence of second phase 124 within matrix 122 may cause insulator-to-metal transition ability of switching layer 120. Because second phase 124 is more conducting than the first phase of the transition metal oxide, a conducting channel may be formed in matrix 122 at a lower voltage than would be normally required through matrix 122 without second phase 124. Second phase 124 may be distributed throughout matrix 122 to allow conducting channels to form through a of switching layer 120 and create a continuous electrical path through switching layer 120.

In addition to second phase 124, catalysts 126 may be located within matrix 122 to interact with the first phase of the transition metal oxide to selectively form and position second phase 124 within matrix 122. In examples herein, catalyst 126 may promote the formation of second phase 124 out of the first phase within matrix 122. Catalyst 126 may be distributed within matrix 122 in such a manner as to selectively form and position second phase 124. Catalyst 126 may be introduced into matrix 122 after capping layer 130 has been coupled to switching layer 120, which may take place in block 325 of method 300.

After coupling first electrode 110 and switching layer 120, method 300 may proceed to block 315, where capping layer 130 is coupled to switching layer 120. Capping layer 130 may cover switching layer 120 and may protect the materials of switching layer 120 from exposure to the external environment or other materials. Capping layer 130 may have a number of materials, including metals, semiconductors, or combinations of materials. In some examples, a metal of capping layer 130 may be the same metal as the metal forming the transition metal oxide of switching layer 120.

After coupling switching layer 120 and capping layer 130, method 300 may proceed to block 320, where second electrode 140 is coupled to capping layer 130. Similar to first electrode 110, second electrode 140 may be an electrical conductor that may serve as the connection for multiphase selector 100 to other components. For example, second electrode 140 may connect multiphase selector 100 to lines of a crossbar array. In a particular example, second electrode 140 may be made of titanium nitride (TiN).

After coupling capping layer 130 and second electrode 140, method 300 may proceed to block 325, where catalysts 126 are implanted into matrix 122 of switching layer 120. In some implementations, catalysts 126 may be implanted within matrix 122 by bombarding multiphase selector 100 with atoms of catalyst 126. Controlling the bombardment of atoms allows the penetration of a controllable amount of catalyst 126 into matrix 122. Further details of processes for implanting catalysts 126 are described in further detail below in relation to method 350 as depicted in FIG. 3B. After implanting catalysts 126, method 300 may proceed to block 330, wherein method 300 may stop.

FIG. 3B is a flowchart depicting an example method 350 for manufacturing a multiphase selector, which may include block 360 for coupling a switching layer to a first electrode, block 365 for coupling a capping layer to the switching layer, block 370 for coupling a second electrode to the capping layer, block 375 for implanting catalysts into a matrix of the switching layer, block 380 for scattering atoms of the capping layer into the matrix of the switching layer, block 385 for ejecting oxygen atoms out of the matrix of the switching layer, and block 390 for thermally annealing the switching layer. Although execution of method 350 is herein described in reference to multiphase selector 100 of FIG. 1A, other suitable parties for implementation of method 350 should be apparent.

Method 350 may start in block 355 and proceed to block 360, where switching layer 120 is coupled to first electrode 110. Block 360 may be similar to block 310 of method 300. Method 350 may then proceed to block 365, where capping layer 130 is coupled to switching layer 120. Block 365 may be similar to block 315 of method 300. Method 300 may then proceed to block 370, where second electrode 140 is coupled to capping layer 130. Block 370 may be similar to block 320 of method 300.

After coupling capping layer 130 and second electrode 140, method 300 may proceed to block 375, where catalysts 126 are implanted into matrix 122 of switching layer 120. In some implementations, catalysts 126 may be implanted within matrix 122 by bombarding multiphase selector 100 with atoms of catalyst 126. Controlling the bombardment of atoms allows the penetration of a controllable amount of catalyst 126 into matrix 122. Generally, bombarding catalyst 126 atoms may pass through second electrode 140 and capping layer 130. The presence of second electrode 140 and capping layer 130 may prevent some or many of the bombarding catalyst 126 atoms from reaching matrix 122. However, when atoms of catalyst 126 collide with some atoms of capping layer 130, method 300 may proceed to block 380, where some of the atoms of capping layer 130 may be scattered into matrix 122 of switching layer 120.

Furthermore, in instances where capping layer 130 includes the same metal as the metal of the transition metal oxide of matrix 122, the recoiled atoms of capping layer 130 may interact with the first phase of the transitional metal oxide in matrix 122 to form second phase 124. For a specific example, Nb atoms of capping layer 130 may be recoiled into matrix 122 having $Nb_2O_5$ as the first phase. The extra Nb atoms may read with $Nb_2O_5$ to form clusters of $NbO_2$ as second phase 124. Such reactions may produce additional oxygen atoms, and in some examples, method 300 may proceed to block 385, where some of these oxygen atoms may be ejected out of matrix 122, leaving oxygen vacancies in matrix 122.

As mentioned above, because it is desirable to have catalyst 126 pass through second electrode 140 but collide with some atoms of capping layer 130, in some examples, second electrode 140 may contain a material with a scattering cross-section that is less than the scattering cross-section of a material of capping layer 130. Specifically, when catalyst 126 atoms, such as Si, are bombarding multiphase selector 100, bombarding atoms may more likely be scattered by atoms of capping layer 130 than by atoms of second electrode 140 due to the larger scattering cross-section of capping layer 130.

Finally, method 350 may proceed to step 390, where switching layer 120 is thermally annealed. An annealing effect may stimulate reactions such as the formation of second phase 124 out of the first phase. For a specific example, a heating anneal effect may promote the reaction of $Nb_2O_5$ with additional Nb to form $NbO_2$. The heat may be generated by the processes described in relation to blocks 375, 380, and 385. Alternatively or in addition, heat may be provided to stimulate annealing. After thermally annealing switching layer 120, method 350 may proceed to block 395 to stop. It should be noted that although blocks 380, 385, and 390 are described herein as occurring sequentially, these blocks of method 350 may occur in any order as a result of the execution of 375 or not at all depending on the implementation.

FIG. 4 depicts a cross-sectional view of an example multiphase selector 400 during the execution of method 350 of FIG. 3B. Multiphase selector 400 may be similar to multiphase selector 100 of FIG. 1A and may have a first electrode, a switching layer, a capping layer, and a second electrode, each of which may be formed and coupled by the execution of blocks 360, 365, and 370 of method 350. During the execution of block 375 to implant catalysts into the matrix of the switching layer, multiphase selector 400 may be bombarded by catalyst atoms 410.

During the bombardment of catalyst atoms 410, some or most of the bombarding atoms may pass through the second electrode, which is depicted as the top-most layer of multiphase selector 400, because the second electrode may have a material with a relatively small scattering cross section. Due to the relatively larger scattering cross section of the capping layer, less catalyst atoms 410 may pass through the capping layer. In FIG. 4, atoms that failed to pass through the second electrode and capping layer are depicted in 415. Catalyst atoms 410 that successfully pass through the second electrode and the capping layer and are implanted into the matrix are depicted as 420.

Some catalyst atoms 410 may collide with atoms of the capping layer during bombardment. As described in relation to block 380 of method 350, some of the atoms of the capping layer may be scattered from the capping layer into the matrix of the switching layer, which is depicted in FIG. 4 as 425. Furthermore, when additional oxygen atoms are produced from certain reactions that form the second phase of the transition metal oxide from the first phase, some of the additional oxygen atoms may be ejected out of the matrix. Some of these ejected oxygen atoms may then settle in the capping layer, as depicted by 430 in FIG. 4, or other locations, including outside of multiphase selector 400. Finally, it should be noted that the bombardment of catalyst atoms 410 may cause a chain reaction as depicted by 435, including a sequence of implanting catalyst atoms into the matrix, scattering atoms from the capping layer into the matrix, and ejecting oxygen atoms out of the matrix.

Figure 5A:
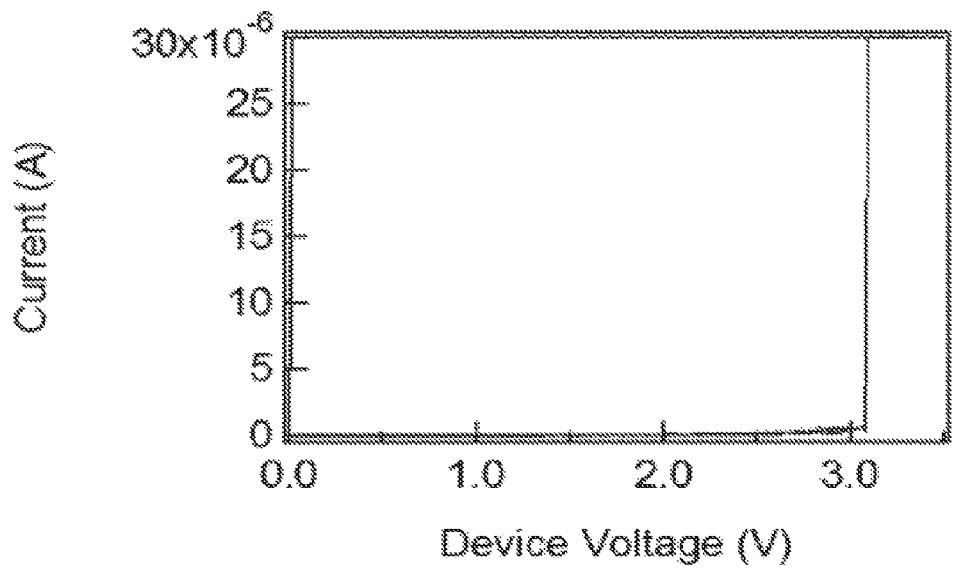
FIG. 5A, on coordinates of current (in A) and voltage (in V), is an example I-V plot of a selector without a multiphase switching layer, according to an example.

FIG. 5A depicts, on coordinates of current (A) and voltage (V), an example I-V plot showing the switching behavior of an example selector with a switching layer that does not contain multiple phases when a voltage is applied across the selector. Specifically, the selector may have a structure containing a first and second electrode and a switching layer with a transition metal oxide. However, because a second phase was not introduced in the switching layer, the I-V characteristics of the selector has not been modified from that of the switching layer. As shown in FIG. 5A, the selector experiences an insulator-to-metal transition when a voltage over roughly 3.0 volts (the threshold voltage) is applied, as indicated by the sharp jump in the amount of current that is passing through the selector.

Figure 5B:
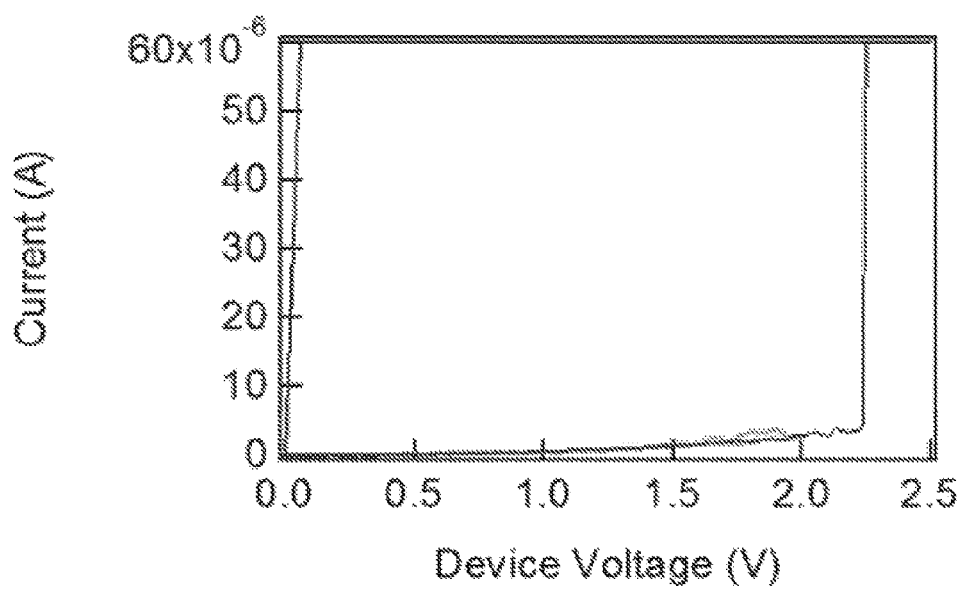
FIG. 5B, on coordinates of current (in A) and voltage in (V), is an example I-V plot of a multiphase selector, according to an example.

FIG. 5B depicts, on coordinates of current (A) and voltage (V), an example I-V plot showing the switching behavior of an example multiphase selector, such as multiphase selector 100 of FIG. 1A, when a voltage is applied across the multiphase selector. Due to the presence of a second, more conducting phase of a transition metal oxide in the switching layer of the multiphase selector, the insulator-to-metal transition threshold voltage may be lower than that of the selector of FIG. 1A. As described above, the second phase may form current channels at lower voltage levels than the first phase. Accordingly, FIG. 5B shows that the multiphase selector experiences an insulator-to-metal transition when a voltage greater than roughly 2.2 volts is applied, as indicated by the sharp jump in the amount of current that is passing through the multiphase selector. This may indicate a lower threshold voltage for the insulator-to-metal transition.

The foregoing describes a number of examples for multiphase selectors. It should be understood that the multiphase selectors described herein may include additional components and that some of the components described herein may be removed or modified without departing from the scope of the multiphase selector or its applications. It should also be understood that the components depicted in the figures are not drawn to scale and thus, the components may have different relative sizes with respect to each other than as shown in the figures.

What is claimed is:

1. A multiphase selector, comprising:
    a first electrode;
    a switching layer coupled to the first electrode, wherein the switching layer comprises: a matrix comprising a first, relatively insulating phase of a transition metal oxide; a second, relatively conducting phase of the transition metal oxide dispersed in the matrix; and catalysts, located within the matrix, to interact with the first phase of the transition metal oxide to selectively form and position the second phase of the transition metal oxide within the matrix and to cause heating to promote an annealing effect;
    a capping layer coupled to the switching layer; and
    a second electrode coupled to the capping layer.

2. The selector of claim 1, wherein the switching layer exhibits insulator-to-metal transition.

3. The selector of claim 1, wherein the catalysts are implanted within the matrix of the switching layer after the capping layer has been coupled to the switching layer.

4. The selector of claim 1, wherein the capping layer comprises a metal, a semiconductor, or multiple materials.

5. The selector of claim 4, wherein the matrix further comprises at least one of:
    scattered atoms of a material of the capping layer; and
    oxygen vacancies.

6. The selector of claim 1, wherein the second electrode comprises a scattering cross-section that is less than that of the capping layer.

7. The selector of claim 1, wherein the second phase of the transition metal oxide comprises clusters having an average size of two nanometers or less.

8. The selector of claim 1, wherein:
    the first phase comprises niobium pentoxide;
    the second phase comprises niobium dioxide; and
    the capping layer comprises niobium.

9. A memory device, comprising a memristor coupled in electrical series to a multiphase selector, wherein the selector comprises:
    a first electrode;
    a switching layer coupled to the first electrode, wherein the switching layer comprises: a matrix comprising a first, relatively insulating phase of a transition metal oxide; a second, relatively conducting phase of the transition metal oxide dispersed in the matrix; and catalysts, located within the matrix, to interact with the first phase of the transition metal oxide to selectively form and position the second phase of the transition metal oxide within the matrix and to cause heating to promote an annealing effect;
    a capping layer coupled to the switching layer; and
    a second electrode coupled to the capping layer.

10. A method for manufacturing a multiphase selector, comprising:
    coupling a switching layer to a first electrode, wherein the switching layer comprises a matrix of a first, relatively insulating phase of a transition metal oxide;
    coupling a capping layer to the switching layer, wherein the capping layer comprises a metal that is the same as the metal of the transition metal oxide of the switching layer;
    coupling a second electrode to the capping layer;
    implanting catalysts into the matrix of the switching layer, wherein the catalysts interacts with the first phase of the transition metal oxide to selectively form and position a second phase of the transition metal oxide and cause heating to promote an annealing effect.

11. The method of claim 10, further comprising at least one of:
    scattering atoms of the material of the capping layer into the matrix of the switching layer; and
    ejecting oxygen atoms out of the matrix of the switching layer.

12. The method of claim 10, further comprising thermally annealing the switching layer.

13. The method of claim 10, wherein the switching layer exhibits insulator-to-metal transition.

14. The method of claim 10, wherein the first electrode and the second electrode each comprises titanium nitride, and wherein the second phase of the transition metal oxide comprises clusters of the second phase having an average size of two nanometers or less.

* * * * *